United States Patent
Kim

(10) Patent No.: US 8,723,019 B2
(45) Date of Patent: May 13, 2014

(54) SOLAR CELL AND METHOD OF MANUFACTURING THE SAME

(75) Inventor: Dong-Ho Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 226 days.

(21) Appl. No.: 13/074,199

(22) Filed: Mar. 29, 2011

(65) Prior Publication Data
US 2012/0111395 A1    May 10, 2012

(30) Foreign Application Priority Data
Nov. 4, 2010   (KR) .................. 10-2010-0109235

(51) Int. Cl.
*H01L 31/00* (2006.01)
*H01L 21/00* (2006.01)
*H01L 21/02* (2006.01)

(52) U.S. Cl.
USPC ............. 136/255; 136/261; 136/257; 438/94; 257/E31.005; 257/190

(58) Field of Classification Search
USPC ............. 136/236.1, 244, 255, 257, 261; 257/190, E31.005; 438/94
See application file for complete search history.

(56) References Cited

U.S. PATENT DOCUMENTS

| | | | | |
|---|---|---|---|---|
| 5,107,317 | A * | 4/1992 | Takasaki | 257/190 |
| 6,340,788 | B1 * | 1/2002 | King et al. | 136/261 |
| 6,372,981 | B1 | 4/2002 | Ueda et al. | |
| 6,627,809 | B1 * | 9/2003 | Koga et al. | 136/236.1 |
| 6,693,298 | B2 | 2/2004 | Eisenbeiser et al. | |
| 2003/0177976 | A1 | 9/2003 | Oki et al. | |
| 2008/0079022 | A1 | 4/2008 | Yamamoto et al. | |
| 2008/0128745 | A1 | 6/2008 | Mastro et al. | |
| 2008/0149915 | A1 | 6/2008 | Mori et al. | |
| 2009/0061557 | A1 | 3/2009 | Akiyama et al. | |
| 2010/0089448 | A1 * | 4/2010 | Yang | 136/257 |
| 2010/0175746 | A1 | 7/2010 | Lee et al. | |
| 2010/0218813 | A1 * | 9/2010 | Guha et al. | 136/255 |
| 2010/0327261 | A1 * | 12/2010 | Hudait et al. | 257/24 |

FOREIGN PATENT DOCUMENTS

| | | |
|---|---|---|
| JP | 2000331934 | 11/2000 |
| KR | 100870526 | 11/2008 |

OTHER PUBLICATIONS

Takamoto et al; "Structural optimization for single junction InGaP solar cells"; Solar Energy Materials and Solar Cells 35 (1994), pp. 25-31.
Takamoto et al; "Over 30% efficient InGaP/GaAs tandem solar cells" Appl.Phys.Lett. 70 (3), Jan. 20, 1997, pp. 381-383.
Friedman et al; "Ge Concentrator Cells for III-V Multijunction Devices" IEEE, 2000, pp. 965-967.

* cited by examiner

*Primary Examiner* — Jonathan Johnson
*Assistant Examiner* — Angelo Trivisonno
(74) *Attorney, Agent, or Firm* — Cantor Colburn LLP

(57) ABSTRACT

A solar cell including: a silicon (Si) substrate; a buffer layer disposed on a side of the silicon substrate; a germanium (Ge) junction disposed on a side of the buffer layer opposite the silicon substrate; a first electrode electrically connected to the germanium junction; and a second electrode electrically connected to the germanium junction, wherein the buffer layer has a lattice constant that increases in a direction from the silicon substrate to the germanium junction.

20 Claims, 7 Drawing Sheets

SOLAR CELL AND METHOD OF MANUFACTURING THE SAME

CROSS-REFERENCE TO RELATED APPLICATION

This application claims priority to Korean Patent Application No. 10-2010-0109235, filed on Nov. 4, 2010, and all the benefits accruing therefrom under 35 U.S.C. §119, the content of which in its entirety is herein incorporated by reference.

BACKGROUND

1. Field

This disclosure relates to a solar cell and a method of manufacturing the same.

2. Description of the Related Art

A solar cell transforms solar energy into electrical energy. Basically, solar cells are diodes formed of PN junctions, and may be classified according to a type of material used in a light absorption layer.

A solar cell may be classified as a silicon solar cell having silicon in a light absorption layer, a compound thin film solar cell having a light absorption layer including $CuInGaSe_2$ ("CIGS"), $CuInSe_2$ ("CIS"), or $CuGaSe_2$ ("CGS"), a Group III-V solar cell, a dye-sensitized solar cell, an organic solar cell, or the like.

There remains a need for a solar cell having improved efficiency and improved manufacturability.

SUMMARY

An aspect of this disclosure provides a solar cell having an excellent short circuit current ("Jsc"), open circuit voltage ("Voc"), and photoelectric conversion efficiency.

Another aspect of this disclosure provides a method of manufacturing a solar cell having excellent economy and workability.

According to an aspect of this disclosure, a solar cell includes: a silicon (Si) substrate; a buffer layer disposed on a side of the silicon substrate; a germanium (Ge) junction disposed on a side of the buffer layer opposite the silicon substrate; a first electrode electrically connected to the germanium junction; and a second electrode electrically connected to the germanium junction, wherein the buffer layer has a lattice constant that increases in a direction from the silicon substrate to the germanium junction.

The buffer layer may have a lattice constant satisfying the following Equation 1:

$$C_{Si} - 0.1 \text{ Å} \leq C_b \leq C_{Ge} + 0.1 \text{ Å}, \quad \text{Equation 1}$$

wherein $C_{Si}$ is a lattice constant of the silicon substrate, $C_b$ is a lattice constant of the buffer layer, and $C_{Ge}$ is a lattice constant of the germanium junction.

A portion of the buffer layer contacting the silicon substrate may have a lattice constant satisfying the following Equation 2:

$$C_{Si} - 0.05 \text{ Å} \leq C_{b1} \leq C_{Si} + 0.05 \text{ Å}, \quad \text{Equation 2}$$

wherein $C_{Si}$ is a lattice constant of the silicon substrate, and $C_{b1}$ is a lattice constant of the portion of the buffer layer contacting the silicon substrate.

A portion of the buffer layer contacting the germanium junction may have a lattice constant satisfying the following Equation 3:

$$C_{Ge} - 0.05 \text{ Å} \leq C_{bn} \leq C_{Ge} + 0.05 \text{ Å}, \quad \text{Equation 3}$$

wherein $C_{Ge}$ is a lattice constant of the germanium junction, and $C_{bn}$ is a lattice constant of the portion of the buffer layer contacting the germanium junction.

The lattice constant of the buffer layer may vary continuously.

Alternately, the buffer layer may include a plurality of layers, and the lattice constant of the buffer layer may vary discontinuously.

The buffer layer may include $GaAs_xP_{1-x}$ wherein $0 \leq x \leq 1$, $Ga_{1-y}In_yP$ wherein $0 \leq y \leq 1$, $AlAs_zP_{1-z}$ wherein $0 \leq z \leq 1$, or a combination thereof.

The silicon substrate may have a thickness of about 50 micrometers (μm) to about 1000 μm.

The buffer layer may have a thickness of about 1 μm to about 10 μm.

The germanium junction may have a thickness of about 1 μm to about 3 μm.

The solar cell may further include at least one junction disposed between the germanium junction and the second electrode. The junction between the germanium junction and the second electrode may have band gap energy of about 0.7 electron volts (eV) to about 3.0 eV. In an embodiment, a first junction and a second junction are sequentially disposed between the germanium junction and the second electrode. The first junction may include GaAs, and the second junction may include GaInP. The at least one junction disposed between the germanium junction and the second electrode may have a band gap energy that increases in a direction from the germanium junction to the second electrode.

According to another aspect of this disclosure disclosed is a method of manufacturing a solar cell, the method including: providing a silicon substrate; disposing a buffer layer on a side of the silicon substrate; disposing a germanium junction on a side of the buffer layer opposite the silicon substrate; disposing a first electrode electrically connected to the germanium junction; and disposing a second electrode electrically connected to the germanium junction, wherein the buffer layer has a lattice constant that increases in a direction from the silicon substrate to the germanium junction.

The buffer layer may have a lattice constant $C_b$ satisfying Equation 1.

The disposing a germanium junction may include molecular beam epitaxy ("MBE"), metal-organic chemical vapor deposition ("MOCVD"), chemical beam epitaxy ("CBE"), or a combination thereof.

The method of manufacturing a solar cell may further include forming at least one junction on a side of the germanium junction before disposing the first and second electrodes. Herein, the at least one junction on a side of the germanium junction may have a band gap energy of about 0.7 eV to about 3.0 eV. In addition, the band gap energy of the at least one junction on a side of the germanium junction may increase in proportion to a distance from the germanium junction.

Other aspects of this disclosure will be further described in the following detailed description.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
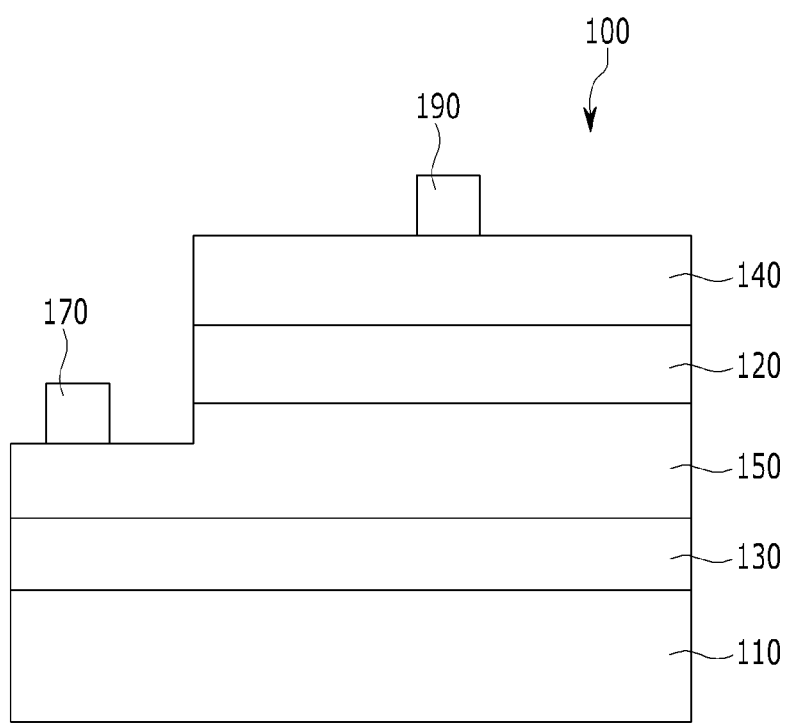
FIG. 1 is a schematic cross-sectional view of an embodiment of a solar cell.

The present disclosure will be described more fully hereinafter with reference to the accompanying drawings, in which exemplary embodiments of this disclosure are shown. As those skilled in the art would realize, the described embodiments may be modified in various different ways, all without departing from the spirit or scope of this disclosure.

In the drawings, the thickness of layers, films, panels, regions, etc., are exaggerated for clarity. Like reference numerals designate like elements throughout the specification. It will be understood that when an element such as a layer, film, or substrate is referred to as being "on" another element, it may be directly on the other element or intervening elements may also be present. In contrast, when an element is referred to as being "directly on" another element, there are no intervening elements present. As used herein, the term "and/or" includes any and all combinations of one or more of the associated listed items.

As used herein, the terms "a" and "an" are open terms and are intended to include the plural forms as well, unless the context clearly indicates otherwise.

It will be understood that, although the terms "first," "second," "third" etc. may be used herein to describe various elements, components, regions, layers, and/or sections, these elements, components, regions, layers and/or sections should not be limited by these terms. These terms are only used to distinguish one element, component, region, layer, or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "a combination thereof" refers to a combination comprising at least one of the named constituents, components, compounds, or elements.

According to an embodiment, a solar cell may include: a silicon (Si) substrate; a buffer layer disposed on a side of the silicon substrate; a germanium (Ge) junction disposed (e.g., formed) on a side of the buffer layer opposite the silicon substrate; a first electrode electrically connected to the germanium junction; and a second electrode electrically connected to the germanium junction. Herein, the buffer layer may have a lattice constant that increases in a direction from the silicon substrate to the germanium junction.

Because the solar cell includes a silicon substrate, it may be fabricated to have a large area with a low cost.

In addition, because a buffer layer is disposed on a side of the silicon substrate, a defect due to a difference (e.g., lattice constant difference) between the crystal lattice of the silicon substrate and the crystal lattice of the germanium junction may be relieved and/or substantially or effectively prevented from forming during formation of the germanium junction.

As a result, the solar cell may have a large area, provide high efficiency, and have a low cost.

Hereinafter, a solar cell 100 according to an embodiment is disclosed in further detail referring to FIG. 1.

FIG. 1 is a schematic cross-sectional view of an embodiment of a solar cell 100.

Hereinafter, a side of the silicon substrate that receives solar energy is referred to as a front side, and a side opposite the front side is referred to as a rear side. Hereinafter, for better understanding and ease of description, the relationship between the upper and lower positions are described relative to the center of the silicon substrate, but is not limited thereto.

The solar cell 100 according to an embodiment includes a silicon substrate 110.

The silicon substrate 110 may support a photoactive layer disposed thereon, wherein the photoactive layer is a junction, and the silicon substrate may or may not be doped. When the substrate comprises silicon, it may have a large area and have a low cost, thereby improving the economics of the solar cell.

The silicon substrate 110 may have a thickness of about 50 micrometers (μm) to about 1000 μm, specifically about 100 μm to about 900 μm, more specifically about 150 μm to about 800 μm. When the silicon substrate 110 has a thickness within the foregoing range, it may effectively support a junction. In particular, the silicon substrate 110 may have a thickness of about 100 μm to about 800 μm, and more specifically, about 150 μm to about 500 μm.

A buffer layer 130 may be disposed on the front side of the silicon substrate 110.

The buffer layer 130 may decrease a lattice constant difference between the silicon substrate 110 and a germanium junction 150 thereon, so that the germanium junction 150 may be more easily formed with substantially or effectively no defects.

The buffer layer 130 may have a lattice constant that increases in a direction from the silicon substrate 110 to the germanium junction 150. In particular, the buffer layer may have a lattice constant $C_b$ satisfying Equation 1.

$$C_{Si}-0.1 \text{ Å} \leq C_b \leq C_{Ge}+0.1 \text{ Å}. \quad \text{Equation 1}$$

In Equation 1, $C_{Si}$ is a lattice constant of the silicon substrate, $C_b$ is a lattice constant of the buffer layer, and $C_{Ge}$ is a lattice constant of the germanium junction.

When the buffer layer 130 has a lattice constant within the foregoing range, it may have less strain and substantially or effectively no defects when disposed on the front side of the silicon substrate 110. In addition, when the germanium junction 150 is disposed (e.g., formed) on the front side of the buffer layer 130, it may have less strain and substantially or effectively no defects.

In particular, a portion of the buffer layer contacting (e.g., adjacent to) the silicon substrate may have a lattice constant $C_{b1}$ satisfying Equation 2. Also, a portion of the buffer layer contacting (e.g., adjacent to) the germanium junction may have a crystal lattice constant $C_{bn}$ satisfying Equation 3.

$$C_{Si}-0.05 \text{ Å} \leq C_{b1} \leq C_{Si} \leq 0.05 \text{ Å}. \quad \text{Equation 2}$$

$$C_{Ge}-0.05 \text{ Å} \leq C_{bn} \leq C_{Ge}+0.05 \text{ Å}. \quad \text{Equation 3}$$

In Equation 2, $C_{Si}$ is a lattice constant of the silicon substrate, and $C_{b1}$ is a lattice constant of a portion of the buffer layer contacting (e.g., adjacent to) the silicon substrate. In Equation 3, $C_{Ge}$ is a lattice constant of the germanium junction, and $C_{bn}$ is a lattice constant of a portion of the buffer layer contacting (e.g., adjacent to) the germanium junction.

The buffer layer 130 may have a continuously changing lattice constant $C_b$. The buffer layer 130 having a continuously changing lattice constant $C_b$ may be disposed by continuously regulating a type and an amount of a source material when forming the buffer layer. The lattice constant $C_b$ of the buffer layer 130 having a continuously changing lattice constant may vary from $C_{b1}$ to $C_{bn}$. The lattice constant $C_b$ of the buffer layer 130 may be an average of $C_{b1}$ and $C_{bn}$. The lattice constant of the buffer layer 130 may satisfy Equations 4 and/or 5.

$$C_{Si}-0.05 \text{ Å} \leq C_b \leq C_{Si}+0.05 \text{ Å} \quad \text{Equation 4}$$

$$C_{Ge}-0.05 \text{ Å} \leq C_b \leq C_{Ge}+0.05 \text{ Å} \quad \text{Equation 5}$$

In Equation 4, $C_{Si}$ is a lattice constant of the silicon substrate, and $C_b$ is a lattice constant (e.g., an average lattice constant) of the buffer layer. In Equation 5, $C_{Ge}$ is a lattice constant of the germanium junction, and $C_b$ is a lattice constant (e.g., an average lattice constant) of the buffer layer.

Alternatively, the buffer layer 130 may be comprised of a plurality of layers, wherein the lattice constant of each layer of the plurality of layers is independently selected, and thus the buffer layer 130 may have a discontinuously-changing lattice constant $C_b$. For example, the buffer layer 130 may comprise a plurality of layers, each layer of the plurality of layers may be different, and each layer of the plurality of layers may have an independently selected lattice constant.

For example, a content of each layer of the plurality of layers may be selected by changing a type and/or an amount of a source material used when disposing the plurality of layers, and thus the buffer layer 130 may have a discontinuously-changing lattice constant.

The buffer layer may be comprised of 1 to about 100 layers, specifically 2 to 50 layers, more specifically 3 to 35 layers. Thus the buffer layer 130 may have n layers, an in an embodiment n may be 100, specifically 50, more specifically 35. In an embodiment a first layer of the buffer layer 130 contacting (e.g., adjacent to) the silicon substrate has a lattice constant $C_{b1}$, a layer between the first layer and an $n^{th}$ layer has a lattice constant between $C_{b1}$ and $C_{bn}$, and the $n^{th}$ layer of the buffer layer 130 contacting (e.g., adjacent to) the germanium junction has a lattice constant of $C_{bn}$. Also the lattice constant of each layer of the plurality of layers may increase in a direction from $C_{b1}$ to $C_{bn}$. Thus $C_{b1}$ may be less than a lattice constant of a layer between the first layer and an $n^{th}$ layer, which may be less than a lattice constant of the $n^{th}$ layer $C_{bn}$.

The buffer layer 130 may comprise $GaAs_xP_{1-x}$ wherein $0 \leq x \leq 1$, $Ga_{1-y}In_yP$ wherein $0 \leq y \leq 1$, $AlAs_zP_{1-z}$ wherein $0 \leq z \leq 1$, or a combination thereof, but is not limited thereto. The buffer layer 130 may be formed by depositing the aforementioned material by molecular beam epitaxy ("MBE"), metal-organic chemical vapor deposition ("MOCVD"), chemical beam epitaxy ("CBE"), or the like, but is not limited thereto.

For example, when the buffer layer 130 comprises $GaAs_xP_{1-x}$ wherein $0 \leq x \leq 1$, the buffer layer 130 may have a composition GaP where it contacts the silicon substrate 110 and a composition GaAs where it contacts the germanium junction 150. Thus x in $GaAs_xP_{1-x}$ may vary in proportion to a distance from the silicon substrate to the germanium junction. Herein, the buffer layer 130 may be a single layer having a continuously changing lattice constant, or may comprise a plurality of layers (e.g., n layers) each having an independently selected lattice constant, and thus the buffer layer may have a discontinuously changing lattice constant. Because the buffer layer 130 is disposed with substantially or effectively no defects on the front side of the silicon substrate 110, and a germanium junction 150 is disposed (e.g., formed) with substantially or effectively no defects on the front side of the buffer layer 130, a solar cell may be fabricated to have excellent photoelectric conversion efficiency and a low cost.

The buffer layer 130 may have a thickness of about 1 μm to about 10 μm, specifically about 1.5 μm to about 9 μm, more specifically about 2 μm to about 8 μm. When the buffer layer 130 has a thickness within the foregoing range, it may have fewer defects due to a difference between the lattice constants of the silicon substrate, the buffer layer, and/or the germanium junction. The buffer layer 130 may have a thickness of about 3 μm to about 6 μm.

Also, in an embodiment wherein the buffer layer is comprised of a plurality of layers, each layer of the plurality of layers may have a thickness of 0.1 μm to about 5 μm, specifically 0.2 μm to about 4 μm, more specifically 0.4 μm to about 3 μm.

The germanium junction 150 is disposed (e.g., formed) on the front side of the buffer layer 130.

For example, the germanium junction 150 may be formed by depositing a material comprising germanium using a method such as molecular beam epitaxy ("MBE"), metal-organic chemical vapor deposition ("MOCVD"), chemical beam epitaxy ("CBE"), or the like, but is not limited thereto.

Because the germanium junction 150 with high quality and substantially no defects is formed on the front side of the buffer layer 130, a solar cell including the disclosed buffer layer and germanium junction may have improved photoelectric conversion efficiency. The structure of the germanium junction 150 for a solar cell can be determined by one of ordinary skill in the art without undue experimentation, and thus is not be illustrated in further detail (D. Friedman et al., Proceedings of 28$^{th}$ Photovoltaic Specialist Conference 965~967 (2000)).

In addition, because the germanium junction 150 is not used as a substrate but as a photoactive layer, it may be thinner than a substrate and a polishing process may be omitted, further reducing cost. Accordingly, a solar cell comprising the disclosed germanium junction and buffer layer may have improved economy and workability.

In particular, the germanium junction 150 may have a thickness of about 1 µm to about 3 µm, specifically about 1.5 µm to about 2.5 µm, more specifically about 2 µm. When the germanium junction 150 has a thickness within the foregoing range, the germanium junction 150 may primarily absorb light in an absorbable wavelength.

The germanium junction 150 may further include at least one junction on the front side of the solar cell. FIG. 1 shows a first junction and a second junction 120 and 140, respectively, disposed on the front side of the germanium junction 150, but is not limited thereto. The first and the second junctions 120 and 140 may be omitted. Further, three or more junctions may be disposed (e.g., formed) on the front side of the germanium junction 150.

The at least one junction on the germanium junction 150 may each independently have band gap energy of about 0.7 electron volts (eV) to about 3.0 eV, specifically about 0.8 eV to about 2.8 eV, more specifically about 1 eV to about 2.6 eV. The band gap energy of the at least one junction may be larger at a greater distance from the germanium junction 150. Thus, for example, the first junction 120 may have a band gap energy which is less than a band gap energy of the second junction 140.

Referring to FIG. 1, the first junction 120 on the germanium junction 150 may have band gap energy of about 0.7 eV to about 1.5 eV, specifically about 0.8 eV to about 1.4 eV, more specifically about 0.9 eV to about 1.3 eV. In particular, the first junction 120 may have a GaAs composition formed by a method of, for example, molecular beam epitaxy ("MBE"), metal-organic chemical vapor deposition ("MOCVD"), chemical beam epitaxy ("CBE"), or the like, but is not limited thereto. The structure of the first junction 120 would be known to one of ordinary skill in the art without undue experimentation, and thus will not be illustrated in further detail (T. Takamoto et al., Applied Physics Letters 70, 381(1997)).

The second junction 140 is disposed on the front side of the first junction 120. The second junction 140 may have band gap energy of about 1.5 eV to about 3.0 eV, specifically about 1.7 eV to about 2.8 eV, more specifically about 1.9 eV to about 2.6 eV. In particular, the second junction 140 may have a composition GaInP and may be formed by a method of, for example, molecular beam epitaxy ("MBE"), metal-organic chemical vapor deposition ("MOCVD"), chemical beam epitaxy ("CBE"), or the like, but is not limited thereto. The structure of the second junction 140 would be known to one of ordinary skill in the art without undue experimentation, and thus will not be illustrated further in detail (T. Takamoto et al., Solar Energy Materials and Solar Cells 35, 25(1994)).

Although not shown in FIG. 1, a tunnel junction may be optionally disposed between the germanium junction 150 and the first junction 120 and between the first junction 120 and the second junction 140. The tunnel junction electrically connects the germanium junction 150 to the first junction 120 and the first junction 120 to the second junction 140. Suitable materials for the tunnel junction are known in the art, and can be selected based on considerations such as stability, availability, processability, and like considerations, without undue experimentation.

The tunnel junction may comprise a photo-transmissive (e.g., transparent) material that selectively transmits light of a selected wavelength region and reflects light in another wavelength region. When the tunnel junction comprises an appropriate material, the germanium junction 150, the first junction 120, and the second junction 140 may absorb more light, improving efficiency of a solar cell.

The first electrode 170 is disposed (e.g., formed) on the front side of the germanium junction 150 and is electrically connected thereto. Also, the second electrode 190 is disposed (e.g., formed) on the front side of the second junction 140 and is electrically connected thereto. FIG. 1 shows an embodiment wherein the second electrode 190 is disposed on the front side of the second junction 140 and shows the first and second junctions 120 and 140, but is not limited thereto. For example, the second electrode 190 may be directly and electrically connected to the germanium junction 150 even when the first and second junctions 120 and 140, respectively, are omitted.

For example, first and second electrodes 170 and 190, respectively, may be fabricated by disposing a highly conductive material such as silver (Ag), gold (Au), or the like using a method such as screen-printing, inkjet-printing, press printing, or a combination thereof, but is not limited thereto.

Although not shown in FIG. 1, before disposing the first electrode 170, a first window layer and a first contact layer may be sequentially disposed on the front surface of the germanium junction 150. However, it is not limited thereto, and the window layer and the contact layer may be omitted.

The first window layer may include a transparent conductive material such as InGaP, AlInP, or AlGaAs doped with, for example, a p-type impurity, but is not limited thereto. The p-type impurity may include an element such as zinc (Zn), carbon (C), or the like, but is not limited thereto.

The first window layer may prevent or effectively eliminate the recombination of electron-hole pairs in the surface of the germanium junction 150, and may prevent or reduce deterioration of the short circuit current ("Jsc").

The first window layer may have a thickness of about 10 nanometers (nm) to about 500 nm, specifically about 25 nm to about 400 nm, specifically about 20 nm to about 100 nm.

The first contact layer may include, for example, a compound such as GaAs or InGaAs, but is not limited thereto.

The first contact layer may be disposed between the first electrode 170 and germanium junction 150, and may reduce the contact resistance between the first electrode 170 and germanium junction 150.

The first contact layer may have a thickness of about 50 nm to about 1 µm, specifically a thickness of about 200 nm to about 500 nm.

After forming the first electrode 170 on the first contact layer, the first contact layer may be etched to remove the region where the first electrode 170 is not formed.

Although not shown in FIG. 1, an anti-reflection coating may be disposed at a position on which the first electrode 170 and the first junction 120 are not present, and may be disposed on the front surface of the germanium junction 150. Alternatively, the anti-reflection coating may be omitted. The anti-reflection coating may comprise an insulating material that absorbs little light, and for example, it may include an oxide such as aluminum oxide ($Al_2O_3$), silicon oxide ($SiO_2$), titanium oxide ($TiO_2$ or $TiO_4$), magnesium oxide (MgO), cerium oxide ($CeO_2$), or a combination thereof, a nitride such as aluminum nitride (AlN), silicon nitride (SiN$_x$), titanium nitride (TiN), or a combination thereof, or an oxynitride such as aluminum oxynitride (AlON), silicon oxynitride (SiON), titanium oxynitride (TiON), or a combination thereof. A combination comprising at least one of the foregoing insulating materials can be used. The anti-reflection coating may comprise a single layer or may comprise a plurality of layers, wherein each layer is independently one of the foregoing insulating materials.

The anti-reflection coating may be formed on the front surface of the germanium junction 150 by screen printing, inkjet printing, press printing, or a combination thereof, with, for example, silicon nitride, but is not limited thereto.

The anti-reflection coating may have a thickness of about 50 nm to about 300 nm, specifically about 80 nm to about 150 nm.

The anti-reflection coating may be disposed on the front surface of the germanium junction 150, and may decrease the reflectance of light on the surface of the solar cell and increases the selectivity of a predetermined wavelength region.

Although not shown in FIG. 1, before disposing (e.g., forming) the second electrode 190, a second window layer and a second contact layer may be sequentially formed on the front surface of the second junction 140. However, it is not limited thereto, and the second window layer and the second contact layer may be omitted.

Unless indicated otherwise, the second window layer and the second contact layer may be the same as the first window layer and the first contact layer described above, respectively.

The second window layer may include a compound such as InGaP, AlInP, or AlGaAs doped with, for example, an n-type impurity, but is not limited thereto. The n-type impurity may include a group IV element such as silicon (Si), or a group VI element such as selenium (Se), tellurium (Te), or the like, but is not limited thereto.

The second window layer may prevent or effectively eliminate the recombination of electron-hole pairs in the surface of the second junction 140, and may prevent or reduce deterioration of the short circuit current ("Jsc").

The second contact layer may reduce the contact resistance between the second electrode 190 and the second junction 140.

After forming the second electrode 190 on the second contact layer, the second contact layer is etched to remove the region where the second electrode 190 is not formed.

Although not shown in FIG. 1, an anti-reflection coating may be disposed at a position on which the second electrode 190 is not present, and may be disposed on the front surface of the second junction 140. Alternatively, the anti-reflection coating may be omitted. Unless it is described otherwise, the anti-reflection coating is the same as described above.

The anti-reflection coating layer may be formed by coating, for example, silicon nitride, or the like, using a method such as screen printing, inkjet printing, press printing, or a combination thereof, on the front side of the second junction 140, but is not limited thereto.

According to another embodiment, a method of manufacturing a solar cell includes: providing a silicon substrate; disposing a buffer layer on a side of the silicon substrate; disposing a germanium junction on a side of the buffer layer opposite the silicon substrate; disposing a first electrode electrically connected to the germanium junction; and disposing a second electrode electrically connected to the germanium junction. Herein, the buffer layer may have a lattice constant that increases in a direction from the silicon substrate to the germanium junction.

The method of manufacturing a solar cell according to another embodiment will be further illustrated referring to FIGS. 2A to 2F and FIG. 1.

FIGS. 2A to 2F are a cross-sectional view sequentially showing a method of manufacturing a solar cell.

Figure 2A:
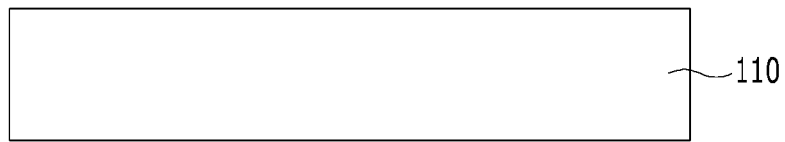
FIGS. 2A and 2F are cross-sectional views of an embodiment of a process of manufacturing a solar cell.

First, referring to FIG. 2A, a silicon substrate 110, such as a silicon wafer is provided. Herein, the silicon substrate 110 may be doped or may not be doped with an impurity.

Figure 2B:
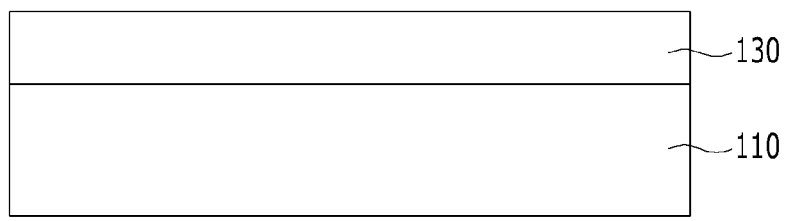

Referring to FIG. 2B, a buffer layer 130 is disposed on the front side of the silicon substrate 110.

The buffer layer 130 may have a lattice constant that increases in proportion to a distance from the silicon substrate 110.

The buffer layer 130 may comprise a GaAs$_x$P$_{1-x}$ wherein 0≤x≤1, and the GaAs$_x$P$_{1-x}$ may be disposed using, for example, molecular beam epitaxy ("MBE"), metal-organic chemical vapor deposition ("MOCVD"), chemical beam epitaxy ("CBE"), or the like, but is not limited thereto.

Figure 2C:
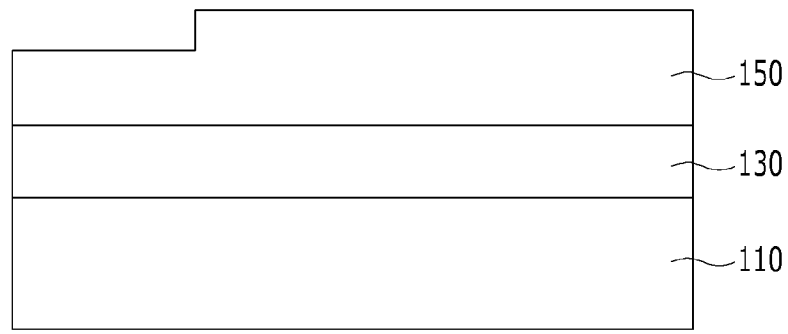

Referring to FIG. 2C, a germanium junction 150 is formed on the front side of the buffer layer 130.

The germanium junction 150 may be formed using a material including germanium and may be disposed using, for example, molecular beam epitaxy ("MBE"), metal-organic chemical vapor deposition ("MOCVD"), chemical beam epitaxy ("CBE"), or the like, but is not limited thereto.

The germanium junction 150 may be formed to have high quality using the molecular beam epitaxy ("MBE"), metal-organic chemical vapor deposition ("MOCVD"), chemical beam epitaxy ("CBE"), or the like, thereby improving photoelectric conversion efficiency of a solar cell.

Figure 2D:

Referring to FIG. 2D, a first junction 120 is formed on the front side of the germanium junction 150. FIG. 2D shows the first junction 120, but if desired the first junction 120 may be omitted.

The first junction 120 may comprise GaAs, for example and may be formed using, for example, molecular beam epitaxy ("MBE"), metal-organic chemical vapor deposition ("MOCVD"), chemical beam epitaxy ("CBE"), or the like, but is not limited thereto.

Although not shown in FIG. 2D, a first tunnel junction may be formed on the front side of the germanium junction 150 before forming the first junction 120. The first tunnel junction may be formed using a method that can be determined by one of skill in the art and without undue experimentation, and will not be described in further detail.

Figure 2E:
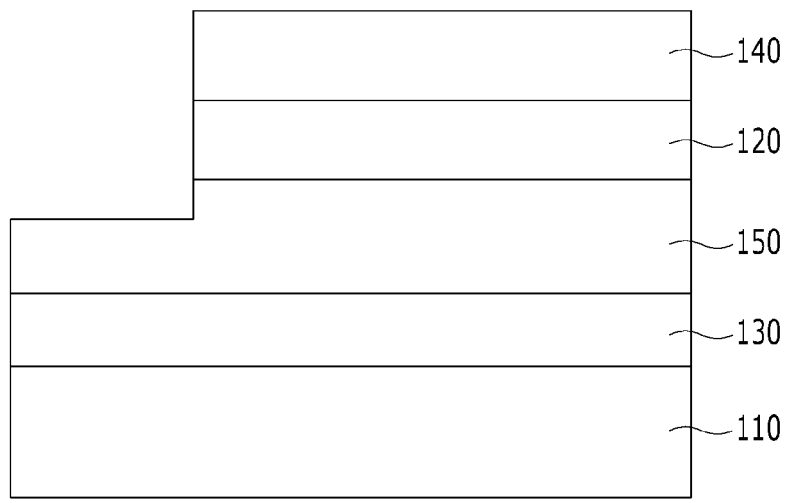

Referring to FIG. 2E, a second junction 140 is formed on the front side of the first junction 120. FIG. 2E shows the second junction 140, but if desired the second junction 140 may be omitted.

The second junction 140 may comprise GaInP, for example, and may be formed using, for example, molecular beam epitaxy ("MBE"), metal-organic chemical vapor deposition ("MOCVD"), chemical beam epitaxy ("CBE"), or the like, but is not limited thereto.

Although not shown in FIG. 2E, a second tunnel junction may be formed on the front side of the first junction 120 before forming the second junction 140. The second tunnel junction may be formed using a method that can be determined by one of skill in the art and without undue experimentation, and will not be described in further detail.

Figure 2F:
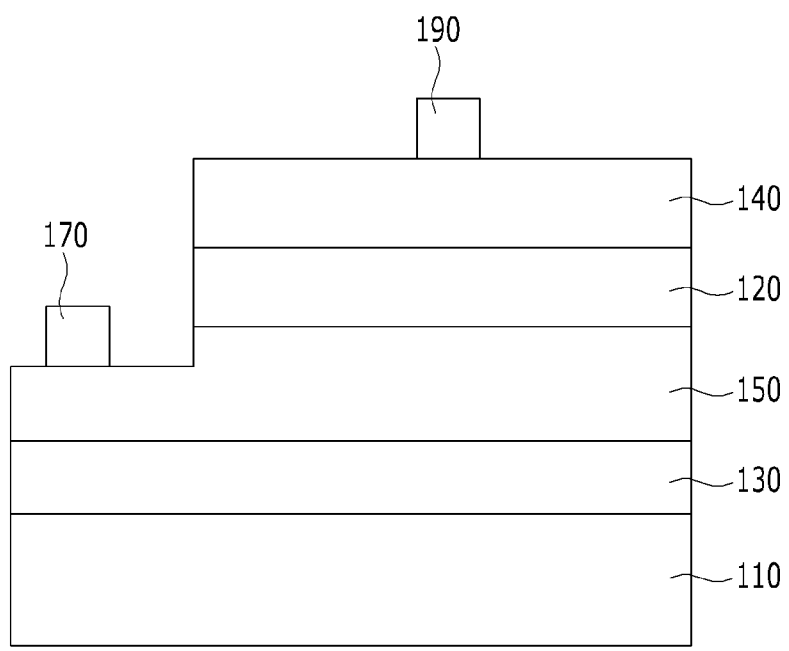

Referring to FIG. 2F, the first electrode 170 may be formed on the front side of the germanium junction 150, and the second electrode 190 may be formed on the front side of the second junction 140.

The first and second electrodes 170 and 190, respectively, may be formed by using a highly conductive material, such as silver (Ag), gold (Au), or the like, by screen printing, inkjet printing, press printing, or a combination thereof, but is not limited thereto.

Although not shown in FIGS. 2A to 2F, window and contact layers may be sequentially disposed on the front side of the germanium junction 150 before forming the first electrode 170 or may be sequentially disposed on the front side of the second junction 140 before forming the second electrode 190. However, the window and contact layers are not limited thereto, and may be omitted, In addition, although not shown in FIGS. 2A to 2F, an anti-reflection coating layer may be disposed where the first electrode 170 and the first junction 120 are not formed on the germanium junction 150 and where the second electrode 190 is not formed on the second junction 140. However, the anti-reflection coating layer is not limited thereto, and may be omitted.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar cell comprising:
   a silicon substrate;
   a buffer layer disposed on a side of the silicon substrate;
   a germanium junction disposed on a side of the buffer layer opposite the silicon substrate;
   a first electrode electrically connected to the germanium junction;
   a first junction disposed on the germanium junction opposite the silicon substrate and having a band gap energy of about 0.7 electron volt to about 1.5 electron volts;
   a second junction disposed on the first junction opposite the silicon substrate and having a band gap energy of about 1.5 electron volts to about 3.0 electron volts; and
   a second electrode disposed on the second junction,
   wherein the buffer layer is disposed between the silicon substrate and the germanium junction, and has a lattice constant that increases in a direction from the silicon substrate to the germanium junction, and
   wherein the buffer layer comprises $GaAs_xP_{1-x}$ wherein $0 \leq x \leq 1$, $Ga_{1-y}In_yP$ wherein $0 \leq y \leq 1$, $AlAs_zP_{1-z}$ wherein $0 \leq z \leq 1$, or a combination thereof and wherein x in $GaAs_xP_{1-x}$ varies in proportion to a distance from the silicon substrate to the germanium junction.

2. The solar cell of claim 1, wherein the buffer layer has a lattice constant satisfying the following Equation 1:

$$C_{Si}-0.1 \text{ Å} \leq C_b \leq C_{Ge}+0.1 \text{ Å}, \quad \text{Equation 1}$$

wherein
$C_{Si}$ is a lattice constant of the silicon substrate,
$C_b$ is a lattice constant of the buffer layer, and
$C_{Ge}$ is a lattice constant of the germanium junction.

3. The solar cell of claim 2, wherein a portion of the buffer layer contacting the silicon substrate has a lattice constant satisfying the following Equation 2:

$$C_{Si}-0.05 \text{ Å} \leq C_{b1} \leq C_{Si}+0.05 \text{ Å}, \quad \text{Equation 2}$$

wherein
$C_{Si}$ is a lattice constant of the silicon substrate, and
$C_{b1}$ is a lattice constant of the portion of the buffer layer contacting the silicon substrate.

4. The solar cell of claim 2, wherein a portion of the buffer layer contacting the germanium junction has a lattice constant satisfying the following Equation 3:

$$C_{Ge}-0.05 \text{ Å} \leq C_{bn} \leq C_{Ge}+0.05 \text{ Å}, \quad \text{Equation 3}$$

wherein
$C_{Ge}$ is a lattice constant of the germanium junction, and
$C_{bn}$ is a lattice constant of the portion of the buffer layer contacting the germanium junction.

5. The solar cell of claim 1, wherein the buffer layer comprises a plurality of layers and the lattice constant of the buffer layer varies discontinuously.

6. The solar cell of claim 5, wherein each layer of the plurality of layers independently has a thickness of about 0.1 micrometers to about 5 micrometers.

7. The solar cell of claim 5, wherein the plurality of layers of the buffer layer comprises a first layer contacting the silicon substrate and having a first lattice constant and an $n^{th}$ layer contacting to the germanium junction and having an $n^{th}$ lattice constant, and the lattice constant of each layer of the plurality of layers increases in a direction from the first layer to the nth layer.

8. The solar cell of claim 1, wherein the silicon substrate has a thickness of about 50 micrometers to about 1000 micrometers.

9. The solar cell of claim 1, wherein the buffer layer has a thickness of about 1 micrometer to about 10 micrometers.

10. The solar cell of claim 1, wherein the germanium junction has a thickness of about 1 micrometer to about 3 micrometers.

11. The solar cell of claim 1, further comprising at least one junction disposed between the germanium junction and the second electrode.

12. The solar cell of claim 11, wherein the at least one junction between the germanium junction and the second electrode comprises junction having a band gap energy of about 0.7 electron volt to about 3.0 electron volts.

13. The solar cell of claim 12, wherein
the first junction comprises GaAs, and
the second junction comprises GaInP.

14. The solar cell of claim 11, wherein the at least one junction disposed between the germanium junction and the second electrode has a band gap energy that increases in a direction from the germanium junction to the second electrode.

15. A method of manufacturing a solar cell, the method comprising:
   providing a silicon substrate;
   disposing a buffer layer on a side of the silicon substrate;
   disposing a germanium junction on a side of the buffer layer opposite the silicon substrate;
   disposing a first electrode electrically connected to the germanium junction;
   disposing a first junction having a band gap energy of about 0.7 electron volt to about 1.5 electron volts on the germanium junction opposite the silicon substrate;
   disposing a second junction having a band gap energy of about 1.5 electron volts to about 3.0 electron volts on the first junction opposite the silicon substrate; and
   disposing a second electrode on the second junction,
   wherein the buffer layer is disposed between the silicon substrate and the germanium junction, and has a lattice constant that increases in a direction from the silicon substrate to the germanium junction, and
   wherein the buffer layer comprises $GaAs_xP_{1-x}$ wherein $0 \leq x \leq 1$, $Ga_{1-y}In_yP$ wherein $0 \leq y \leq 1$, $AlAs_zP_{1-z}$ wherein $0 \leq z \leq 1$, or a combination thereof and wherein x in GaAs$_x$P$_{1-x}$ varies in proportion to a distance from the silicon substrate to the germanium junction.

16. The method of claim 15, wherein the buffer layer has a lattice constant satisfying the following Equation 1:

$$C_{Si} - 0.1 \text{ Å} \leq C_b \leq C_{Ge} + 0.1 \text{ Å} \quad \quad \text{Equation 1}$$

wherein $C_{Si}$ is a lattice constant of the silicon substrate, $C_b$ is a lattice constant of the buffer layer, and $C_{Ge}$ is a lattice constant of the germanium junction.

17. The method of claim 15, wherein the disposing a germanium junction comprises molecular beam epitaxy, metal-organic chemical vapor deposition, chemical beam epitaxy, or a combination thereof.

18. The method of claim 15, further comprising forming at least one junction on a side of the germanium junction before disposing the first and second electrodes.

19. The method of claim 18, wherein the at least one junction on a side of the germanium junction has a band gap energy of about 0.7 electron volt to about 3.0 electron Volts.

20. The method of claim 19, wherein the band gap energy of the at least one junction on a side of the germanium junction increases in proportion to a distance from the germanium junction.

* * * * *